United States Patent
Hagiwara

(10) Patent No.: US 12,294,126 B2
(45) Date of Patent: May 6, 2025

(54) POWER CONVERSION SYSTEM

(71) Applicant: TOYOTA JIDOSHA KABUSHIKI KAISHA, Toyota (JP)

(72) Inventor: Takaharu Hagiwara, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 490 days.

(21) Appl. No.: 17/737,189

(22) Filed: May 5, 2022

(65) Prior Publication Data
US 2022/0393207 A1  Dec. 8, 2022

(30) Foreign Application Priority Data
Jun. 3, 2021  (JP) ................................ 2021-093602

(51) Int. Cl.
| G01R 31/64 | (2020.01) |
| G01R 31/42 | (2006.01) |
| H01M 8/04858 | (2016.01) |
| H02M 1/00 | (2006.01) |
| H02M 3/07 | (2006.01) |

(52) U.S. Cl.
CPC ........ *H01M 8/04888* (2013.01); *G01R 31/42* (2013.01); *G01R 31/64* (2020.01); *H02M 1/0009* (2021.05); *H02M 3/07* (2013.01)

(58) Field of Classification Search
CPC ... H01M 8/04888; G01R 31/42; G01R 31/64; H02M 3/157
See application file for complete search history.

(56) References Cited

U.S. PATENT DOCUMENTS

| 2009/0186247 | A1  | 7/2009  | Hirakawa et al. |
| 2010/0286939 | A1* | 11/2010 | Oh .................... H01M 8/04649 702/65 |
| 2016/0329829 | A1* | 11/2016 | Ayai ........................ H02M 7/44 |
| 2018/0225891 | A1* | 8/2018  | Lambourne ........ H01R 13/6397 |
| 2018/0278180 | A1* | 9/2018  | Toyoda ................ H02H 7/1227 |
| 2019/0199086 | A1* | 6/2019  | Li ............................ H02H 7/08 |
| 2020/0023742 | A1* | 1/2020  | Takinai ................... B60L 50/51 |

FOREIGN PATENT DOCUMENTS

| JP | 2008-043174 A | 2/2008 | |
| JP | 2009-176491 A | 8/2009 | |
| JP | 2012-115018 A | 6/2012 | |
| JP | 2020058179 | * 10/2018 | ............. H02M 7/48 |
| JP | 2019-153403 A | 9/2019 | |

\* cited by examiner

*Primary Examiner* — Dominic E Hawkins
(74) *Attorney, Agent, or Firm* — Oliff PLC

(57) ABSTRACT

A power conversion system that performs power conversion between a power supply and a load includes a pair of input ends, a pair of output ends, reactor, diode, switch, capacitor, current sensor, and control unit. The control unit is configured to perform a diagnostic process to diagnose deterioration of the capacitor. The diagnostic process includes a switching process to add an alternating-current component that fluctuates at a predetermined frequency to a voltage applied from the power supply to a series circuit of the reactor and the capacitor, by repeatedly turning on and off the switch, a specifying process to specify the phase difference or gain which an alternating-current component that appears in the current measured by the current sensor has, relative to the added alternating-current component, and a determining process to determine whether the phase difference or gain specified by the specifying process is within a normal range.

7 Claims, 4 Drawing Sheets

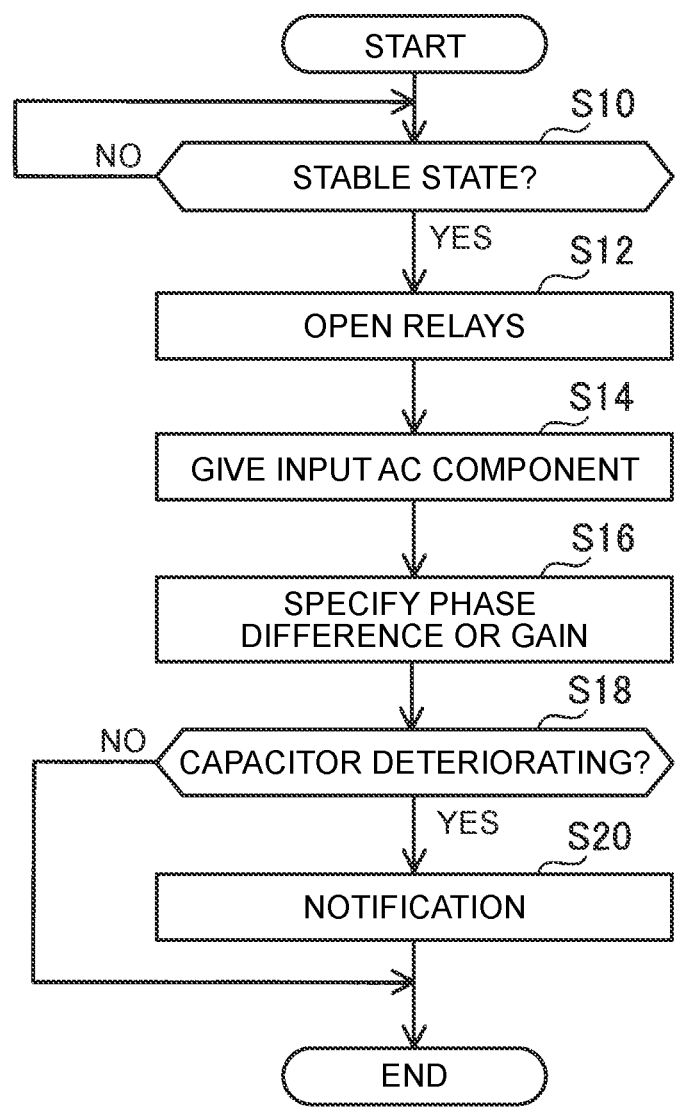

POWER CONVERSION SYSTEM

CROSS-REFERENCE TO RELATED APPLICATION

This application claims priority to Japanese Patent Application No. 2021-093602 filed on Jun. 3, 2021, incorporated herein by reference in its entirety.

BACKGROUND

1. Technical Field

The technology disclosed in the specification relates to a power conversion system.

2. Description of Related Art

A power conversion system that performs power conversion between a fuel cell and a load is described in Japanese Unexamined Patent Application Publication No. 2019-153403 (JP 2019-153403 A). The power conversion system includes a pair of input ends, a pair of output ends, a reactor, a diode, a switch, a capacitor, a current sensor, a voltage sensor, and a control unit. The control unit can diagnose deterioration of the fuel cell, based on the impedance of the fuel cell determined from the voltage and current of the fuel cell.

In the above power conversion system, the reactor, diode, and switch constitute a DC-DC converter. The DC-DC converter boosts the direct-current (DC) power from a power supply such as a fuel cell, by turning on and off the switch at a high speed, and outputs the resulting power from the pair of output ends. The capacitor is connected between the pair of output ends, so as to curb generation of ripple current.

SUMMARY

Generally, capacitors deteriorate through repeated charging and discharging. As a capacitor deteriorates, the capacitance of the capacitor is reduced, and the capacitor may not be able to sufficiently reduce the ripple current. Thus, in a method employed in the capacitor design stage, the required performance, such as the number of cycles, time, etc. of charge and discharge, is assumed in advance, and the capacitor is designed to satisfy the required performance. However, when the environmental temperature actually experienced by the capacitor is different from the assumed temperature range, for example, the deterioration of the capacitor may be accelerated. Therefore, the capacitor may deteriorate significantly in a shorter period than expected, depending on the environmental temperature experienced by the capacitor, and the ripple current may not be sufficiently reduced thereafter. To avoid this situation, a method of diagnosing deterioration of capacitors, based on the actual state of the capacitors, is demanded.

The technology disclosed in the specification is embodied in the form of a power conversion system. The power conversion system performs power conversion between a power supply and a load, and includes a pair of input ends connected to the power supply, a pair of output ends connected to the load, a reactor having one end connected to one of the pair of input ends, a diode having an anode connected to the other end of the reactor, and a cathode connected to one of the pair of output ends, a switch having one end connected to the other end of the reactor, and the other end connected to the other of the pair of input ends and the other of the pair of output ends, a capacitor connected between the pair of output ends, a current sensor configured to measure a current flowing through the reactor, and a control unit configured to control operation of the switch. The control unit is configured to perform a diagnostic process to diagnose deterioration of the capacitor. The diagnostic process includes a switching process to add a first alternating-current component that fluctuates at a predetermined frequency to a voltage applied from the power supply to a series circuit of the reactor and the capacitor, by repeatedly turning on and off the switch, a specifying process to specify a phase difference or a gain which a second alternating-current component that appears in the current measured by the current sensor has, relative to the first alternating-current component added by the switching process, and a determining process to determine whether the phase difference or the gain specified in the specifying process is within a normal range.

In the power conversion system as described above, the reactor, diode, and switch constitute a DC-DC converter, and the capacitor for reducing ripple current is connected to the high-voltage side of the DC-DC capacitor. In this circuit structure, there is an LC series circuit in which the reactor and the capacitor are connected in series to the power supply. The control unit performs the diagnostic process to diagnose deterioration of the capacitor, by using the LC series circuit. In the diagnostic process, an alternating-current (AC) component that appears in the current flowing through the reactor (hereinafter referred to as "output AC component") is observed while an alternating-current (AC) component that fluctuates at a predetermined frequency (hereinafter referred to as "input AC component") is added to the voltage applied from the power supply to the LC series circuit. A phase difference and a gain between the input AC component and the output AC component are generated according to the resonance frequency of the LC series circuit, and the resonance frequency of the LC series circuit changes according to the capacitance of the capacitor. Accordingly, any change in the capacitance of the capacitor, namely, whether the capacitor is deteriorating or not, can be determined based on the phase difference or gain between the input AC component and the output AC component.

Thus, even when the capacitor deteriorates earlier than expected, such as when the environmental temperature experienced by the capacitor is different from the assumed temperature range, the control unit can diagnose deterioration of the capacitor, based on the actual state of the capacitor. When the capacitor is diagnosed to be deteriorated, appropriate measures such as replacement of the capacitor can be taken. Thus, in the power conversion system, the capacitor can maintain the function of reducing the ripple current.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 5 is a flowchart illustrating one example of a diagnostic process performed by a control unit.

DETAILED DESCRIPTION OF EMBODIMENTS

Figure 1:
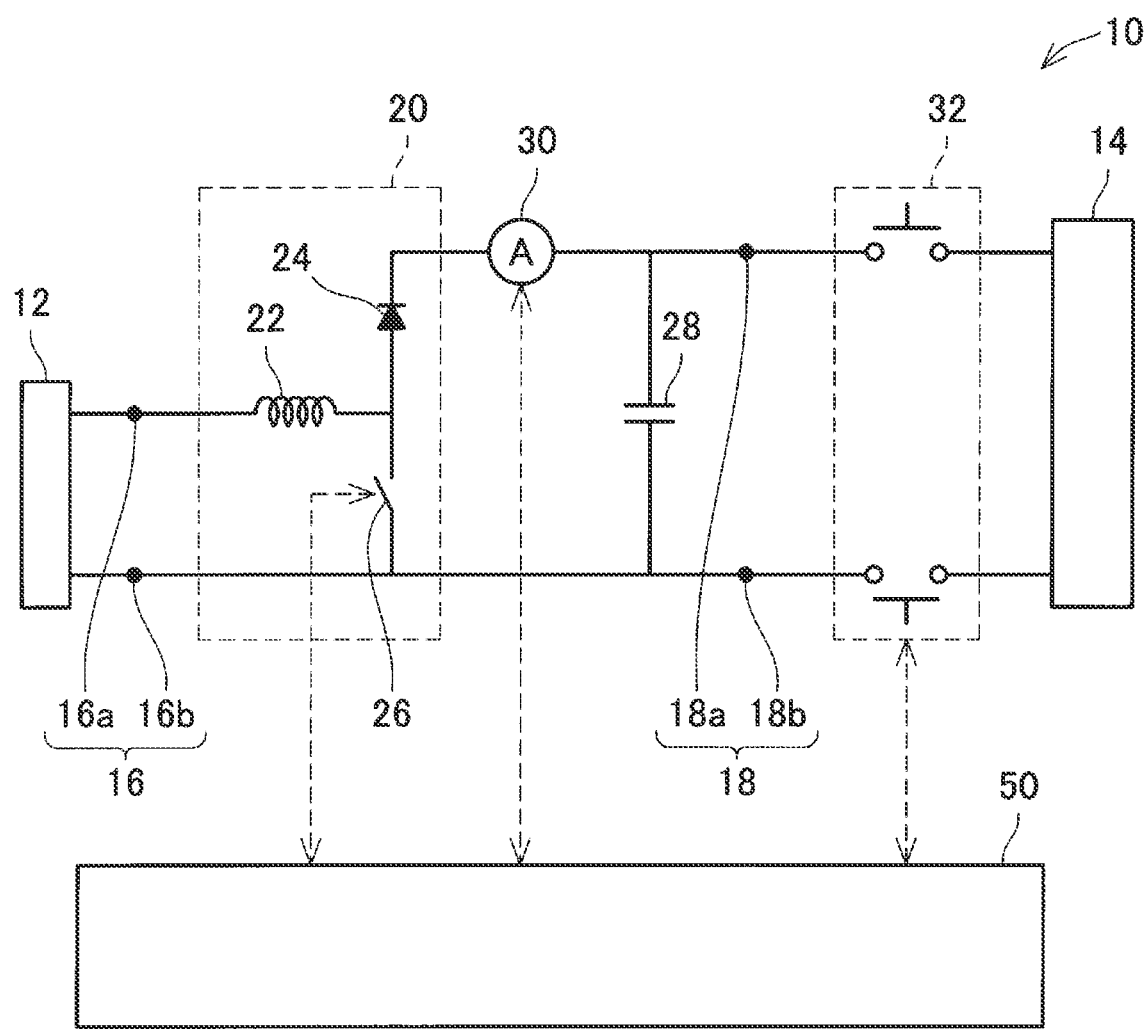
FIG. 1 is a view illustrating the configuration of a power conversion system.

In one embodiment of the technology, the control unit may specify the phase difference in the specifying process. In this case, the control unit may determine in the determining process whether the phase difference specified is within the normal range. Namely, the deterioration of the capacitor may be diagnosed, based on the phase difference specified in the specifying process. However, in another embodiment, the gain may be specified in the specifying process, and the deterioration of the capacitor may be diagnosed based on the gain.

In one embodiment of the technology, the power conversion system may further include a pair of relays provided between the pair of output ends and the load. In this case, the control unit may perform an opening process to turn off the pair of relays, before executing the diagnostic process. With this arrangement, it is possible to remove the influence due to the presence of the load, and perform the diagnostic process with improved accuracy. Also, the ripple current generated by the switching process can be prevented from flowing into the load. In this manner, deterioration of the load can be avoided, for example.

In one embodiment of the technology, the diagnostic process may further include a notifying process to perform a predetermined notifying operation, when the control unit determines in the determining process that the phase difference or the gain is outside the normal range. With this configuration, for example, the user, administrator, etc. of the power conversion system can recognize deterioration of the capacitor, and therefore take appropriate measures such as replacing the capacitor.

In one embodiment of the technology, the power supply may be a fuel cell. In this connection, the power supply is not necessarily limited to the fuel cell, but may be an engine generator, a generator such as a solar power generation system, or a secondary battery such as a lithium-ion battery.

In one embodiment of the technology, the power conversion system may be installed on a vehicle. In other embodiments, the power conversion system may be installed on a mobile vehicle such as a ship or an airplane, or may be installed on a stationary power generation system, or the like.

In the above embodiment, the diagnostic process may be performed when the vehicle is stopped. When the vehicle is stopped, no output from the power conversion system to the load is required. Thus, the control unit can perform the opening process to turn off the pair of relays before executing the diagnostic process.

Referring to the drawings, a power conversion system 10 will be described. The power conversion system 10 is provided between a power supply 12 and a load 14, and performs power conversion between them. The power conversion system 10 of this embodiment includes a DC-DC converter 20, and can boost direct-current (DC) power from the power supply 12 and output it to the load 14 side. Between the DC-DC converter 20 and the load 14, another power conversion circuit such as an inverter circuit may be further provided as needed. The power conversion system 10 of this embodiment may be installed on an automobile such as a hybrid electric vehicle, fuel cell electric vehicle, or battery electric vehicle, for example. However, the technology disclosed in this embodiment is not limitedly applied to the power conversion system 10 installed on the automobile, but may be used for power conversion systems for various applications, including mobile vehicles such as ships and airplanes, and stationary power generation systems.

In the power conversion system 10 of this embodiment, the power supply 12 may be a fuel cell, as one example. However, the power supply 12 is not necessarily limited to the fuel cell, but may be an engine generator, a generator such as a solar power generation system, or a secondary battery such as a lithium-ion battery. Also, in the power conversion system 10 of this embodiment, the load 14 may be a three-phase motor, for example, a motor for driving an automobile. In this case, a three-phase inverter that generates three-phase alternating-current (AC) power having U-phase, V-phase, and W-phase may be provided between the power conversion system 10 and the load 14.

As shown in FIG. 1, the power conversion system 10 includes a pair of input ends 16 connected to the power supply 12, and a pair of output ends 18 connected to the load 14. The input ends 16 include a positive input end 16a connected to the positive pole of the power supply 12, and a negative input end 16b connected to the negative pole of the power supply 12. The output ends 18 include a positive output end 18a connected to the positive pole of the load 14, and a negative output end 18b connected to the negative pole of the load 14. The negative input end 16b and the negative output end 18b are connected to each other and kept at the same potential.

As shown in FIG. 1, the DC-DC converter 20 further includes a reactor 22, a diode 24, and a switch 26. The reactor 22 is connected at one end to the positive input end 16a, and connected at the other end to the anode of the diode 24. The cathode of the diode 24 is connected to the positive output end 18a. Accordingly, the reactor 22 and the diode 24 are connected in series, between the positive input end 16a connected to the power supply 12 and the positive output end 18a connected to the load 14. One end of the switch 26 is connected to the other end of the reactor 22 and the anode of the diode 24. The other end of the switch 26 is connected to the negative input end 16b and the negative output end 18b.

In the DC-DC converter 20 constructed as described above, when the switch 26 is turned on, a closed circuit that connects the power supply 12 and the reactor 22 with each other is formed, and electric energy is supplied from the power supply 12 to the reactor 22 and stored in the reactor 22. Then, when the switch 26 is turned off, the electric energy stored in the reactor 22 is output to the pair of output ends 18 side, along with the electric energy from the power supply 12. Thus, in the DC-DC converter 20, when the switch 26 is alternately turned on and off at a predetermined frequency (namely, in predetermined timing), the DC power from the power supply 12 is boosted and output from the pair of output ends 18 to the load 14.

As shown in FIG. 1, the power conversion system 10 further includes a capacitor 28. The capacitor 28 is a so-called smoothing capacitor, and smooths the DC power delivered from the DC-DC converter 20. The capacitor 28 is connected between the output ends 18. Namely, the capacitor 28 is connected between the positive output end 18a and the negative output end 18b. Thus, the capacitor 28 can reduce ripple current generated when the switch 26 is alternately turned on and off at the predetermined frequency.

As shown in FIG. 1, the power conversion system 10 further includes a control unit 50. The control unit 50 is a controller that monitors and controls operation of the power conversion system 10. The control unit 50 is communicably connected to the switch 26, and is configured to be able to perform PWM (Pulse Width Modulation) control on the switch 26. Under the PWM control, the switch 26 is turned on and off at a given frequency, and the time for which the switch 26 is turned on (so-called duty ratio) is adjusted based on a demand from the load 14. The control unit 50 can regulate the power supplied to the load 14, according to the demand from the load 14, by performing the PWM control on the switch 26.

As shown in FIG. 1, the power conversion system 10 further includes a current sensor 30. In one example, the current sensor 30 is located between the cathode of the diode 24 and the positive output end 18a, and can measure the current that flows from the power supply 12 through the reactor 22 and is delivered from the positive output end 18a. The current sensor 30 is communicably connected to the control unit 50, and the control unit 50 is configured to be able to obtain measurement results from the current sensor 30. The specific configuration and location of the current sensor 30 are not particularly limited. The current sensor 30 is only required to measure the current flowing through the reactor 22.

As shown in FIG. 1, the power conversion system 10 further includes a pair of relays 32. The pair of relays 32 can electrically connect and disconnect the power supply 12 and the load 14. The pair of relays 32 is provided between the pair of output ends 18 and the load 14. When the pair of relays 32 is turned on, the output ends 18 are electrically connected to the load 14, and the power supply 12 and the load 14 are electrically connected via the DC-DC converter 20. On the other hand, when the pair of relays 32 is turned off, the output ends 18 are electrically disconnected from the load 14, and the power supply 12 and the load 14 are also electrically disconnected from each other. The pair of relays 32 is turned on and off under control of the control unit 50. However, in other embodiments, the ON and OFF states of the relays 32 may be switched by another controller or the user, in place of the control unit 50.

Figure 2:
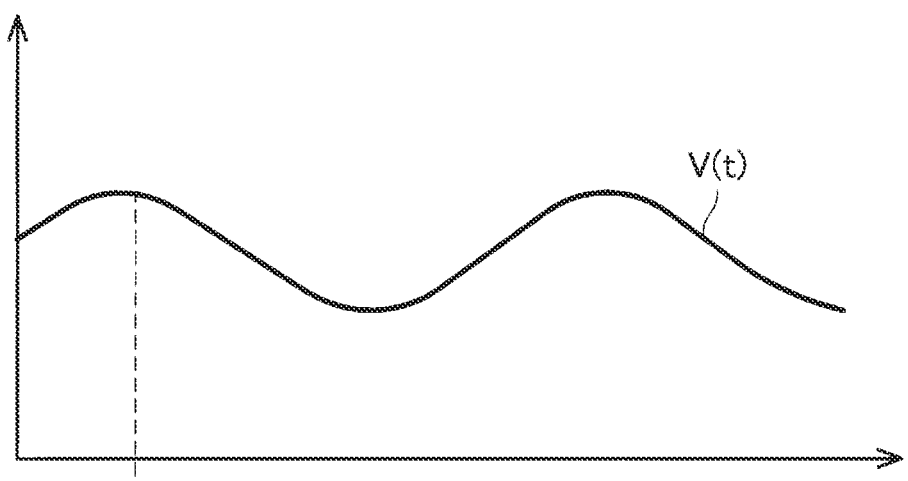
FIG. 2 shows one example of an input alternating-current (AC) component given to an LC series circuit in the upper graph, and one example of an output alternating-current (AC) component that appears in the LC series circuit when the input AC component is given in the lower graph.
Figure 2:
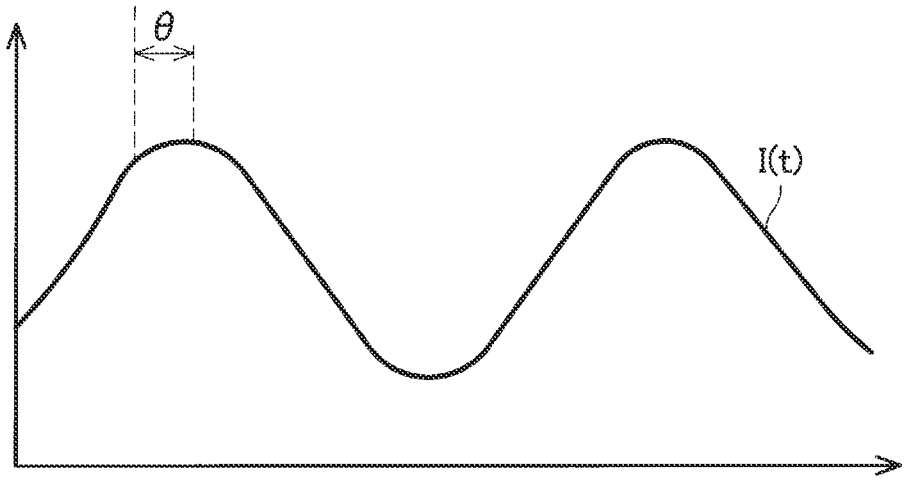

In the above configuration, the reactor 22 and the capacitor 28 form an LC series circuit against the power supply 12. The LC series circuit has a resonance frequency fx determined by the reactance of the reactor 22 and the capacitance of the capacitor 28. As shown in FIG. 2, when an alternating-current (AC) component is added to the voltage V(t) applied to the LC series circuit, an AC component also appears in the current I(t) that flows in the LC series circuit. In the following description, the AC component added to the voltage V(t) may be referred to as "input AC component", and the AC component that appears in the current I(t) may be referred to as "output AC component". While the input AC component and the output AC component have the same frequency, a phase difference θ appears between these components.

Figure 3:
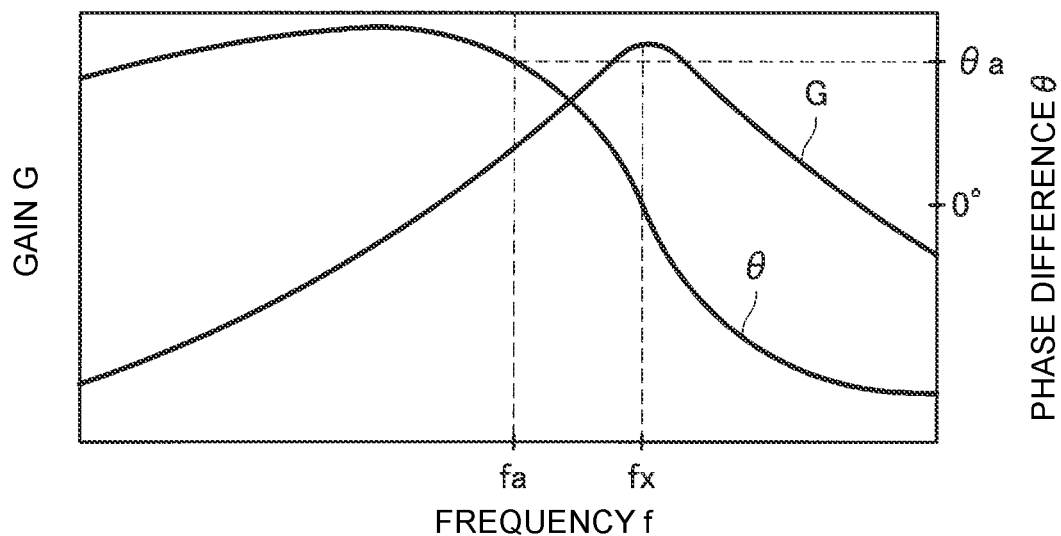
FIG. 3 is a view showing one example of phase different θ and gain G between the input AC component and the output AC component when deterioration of a capacitor is not in progress.

As shown in FIG. 3, the phase difference θ between the input AC component and the output AC component changes according to the relationship between the frequency f of the input AC component and the resonance frequency fx of the LC series circuit. For example, when the frequency f of the input AC component is equal to the resonance frequency fx of the LC series circuit, the phase difference θ between the input AC component and the output AC component becomes equal to zero. When the frequency f of the input AC component is smaller than the resonance frequency fx of the LC series circuit, the phase different θ becomes a positive value. When the frequency f of the input AC component is larger than the resonance frequency fx of the LC series circuit, the phase difference θ becomes a negative value.

As described above, the resonance frequency fx of the LC series circuit is determined by the reactance of the reactor 22 and the capacitance of the capacitor 28. Since the reactance of the reactor 22 and the capacitance of the capacitor 28 are known, an assumed phase difference θa (e.g., 65°) is observed between the input AC component and the output AC component when the input AC component having a given frequency fa (e.g., 1 kHz) is given to the LC series circuit.

However, the capacitor 28 deteriorates through repeated charging and discharging. As the deterioration of the capacitor 28 progresses, the capacitance of the capacitor 28 changes. While the capacitance of the capacitor 28 is normally reduced as the deterioration of the capacitor 28 progresses, the manner of change of the capacitance is not particularly limited. As the capacitance of the capacitor 28 changes, the resonance frequency fx of the LC series circuit also changes. Namely, the resonance frequency fx of the LC series circuit changes in accordance with the progress of deterioration of the capacitor 28.

Figure 4:
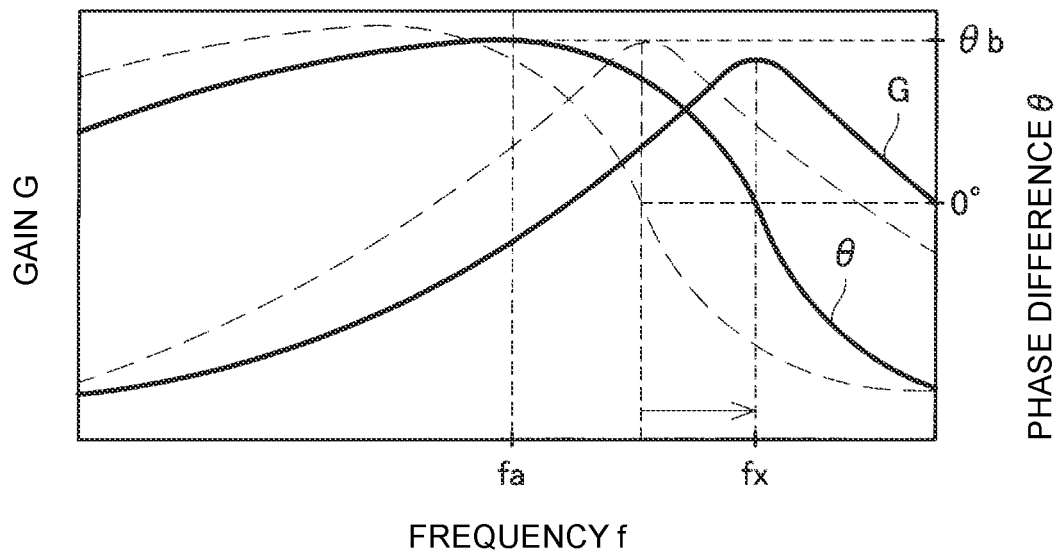
FIG. 4 is a view showing one example of the phase difference θ and gain between the input AC component and the output AC component when deterioration of the capacitor is in progress, wherein the phase difference θ and gain G of FIG. 3 are indicated by broken lines.

As shown in FIG. 4, as the resonance frequency fx of the LC series circuit changes, the relationship between the frequency f of the input AC component and the phase difference θ that appears between the input AC component and the output AC component also changes. Accordingly, in a condition where the deterioration of the capacitor 28 is in progress, when the input AC component having the given frequency fa (e.g., 1 kHz) is given to the LC series circuit, a phase difference Ob (e.g., 72°) that is different from the assumed phase difference θa is generated in the measured output AC component. In other words, where the phase difference Ob that is different from the assumed phase difference θa is generated in the measured output AC component when the input AC component of the given frequency fa is given to the LC series circuit, it can be determined that the deterioration of the capacitor 28 is in progress. On the other hand, when the assumed phase difference θa appears in the detected output AC component, it can be determined that the deterioration of the capacitor 28 has not progressed.

As shown in FIG. 3 and FIG. 4, the magnitude of the output AC component relative to the input AC component (i.e., the gain G) also changes according to the relationship between the frequency f of the input AC component and the resonance frequency fx of the LC series circuit. For example, when the frequency f of the input AC component is equal to the resonance frequency fx of the LC series circuit, the gain G of the output AC component relative to the input AC component becomes the maximum. As the frequency f of the input AC component shifts away from the resonance frequency fx of the LC series circuit, the gain G of the output AC component relative to the input AC component decreases. Accordingly, it can be determined that the deterioration of the capacitor 28 is in progress, in the case where the measured output AC component has an amplitude that is different from the assumed amplitude when the input AC component having a given frequency fa is given to the LC series circuit. On the other hand, when the measured output AC component has the assumed amplitude, it can be determined that the deterioration of the capacitor 28 has not progressed.

On the basis of the above findings, in the power conversion system 10 of this embodiment, the control unit 50 is configured to be able to perform a diagnostic process to diagnose deterioration of the capacitor 28. Referring to FIG. 5, one example of the diagnostic process performed by the control unit 50 will be described in detail.

In FIG. 5, when the control unit 50 determines that the power conversion system 10 is in a stable state (YES in step S10), it proceeds to step S12 and subsequent steps. It can be said that the power conversion system 10 is in the stable state, when no output is required from the power conversion system 10 to the load 14. For example, when the power conversion system 10 is installed on a vehicle, the control unit 50 determines that the power conversion system 10 is in the stable state and proceeds to step S12 and subsequent steps when the vehicle is stopped. On the other hand, when the control unit 50 determines that the power conversion system 10 is not in the stable state (NO in step S10), the control unit 50 returns to step S10. Namely, the control unit 50 repeatedly executes step S10, until it determines that the power conversion system 10 is in the stable state.

In step S12, the control unit 50 performs an opening process to turn off the pair of relays 32, before executing the diagnostic process of step S14 and subsequent steps. When the relays 32 are turned off, the load 14 is electrically disconnected from the power conversion system 10. Thus, it is possible to remove the influence due to the presence of the load 14, and perform the diagnostic process with improved accuracy. In step S14, the control unit 50 performs a switching process to give the input AC component as described above. In the switching process, the switch 26 is repeatedly turned on and off, so that the AC component (namely, the input AC component) that fluctuates at the given frequency fa is added to the voltage applied from the power supply 12 to the LC series circuit. In step S16, the control unit 50 performs a specifying process to specify the phase difference θ or gain G which the AC component that appears in the current measured by the current sensor 30 (namely, the output AC component) has, relative to the AC component given by the switching process of step S14. Namely, in the specifying process, the phase difference θ or gain G which the output AC component has, relative to the input AC component given by the switching process, is specified.

In step S18, the control unit 50 performs a determining process to determine whether the phase difference θ or gain G specified by the specifying process is within a normal range. The normal range is determined by experiment or simulation, and stored in advance in the control unit 50. The normal range is not particularly limited to any specific example, but may be a range defined by one or both of the predetermined lower limit and upper limit.

Although not particularly limited, the normal range for the phase difference θ, for example, can be empirically determined from the phase difference θ which the output AC component has, when the input AC component having the given frequency fa is given to the LC series circuit, with respect to each of the initial state of the capacitor 28, and the state in which deterioration of the capacitor 28 is in progress. More specifically, the range from the phase difference θa (see FIG. 3) in the initial state of the capacitor 28 to the phase difference θb (see FIG. 4) in the state in which the deterioration of the capacitor 28 is in progress may be set as the normal range. Here, the initial state of the capacitor 28 means the state in which the deterioration of the capacitor 28 has not progressed, and the capacitance of the capacitor 28 is equal to the design value.

Similarly, the normal range of the gain G can also be empirically determined from the gain G which the output AC component has, when the input AC component having the given frequency fa is given to the LC series circuit, with respect to each of the initial state of the capacitor 28, and the state in which the deterioration of the capacitor 28 is in progress. The specific determining method is similar to the above method regarding the phase difference θ, and thus will not be stated herein.

When the control unit 50 determines in the determining process of step S18 that the phase difference θ or the gain G is outside the normal range (YES in step S18), it executes a notifying process to perform a predetermined notifying operation (step S20). The predetermined notifying operation includes, for example, direct notification of the determination result to the user, administrator, etc. of the power conversion system 10. Furthermore, the predetermined notifying operation includes indirect notification of the determination result to the user, administrator, etc. of the power conversion system 10, by performing a given operation (e.g., turn-on of a notification light) indicating that the phase difference θ or gain G is determined as being outside the normal range. Thus, the predetermined notifying operation is not particularly limited to any specific method, provided that the user, administrator, etc. of the power conversion system 10 can be notified that the deterioration of the capacitor 28 is in progress.

The control unit 50 finishes the diagnostic process when it determines in step S18 that the phase difference θ or gain G is within the normal range (NO in step S18), or executes step S20.

As described above, the control unit 50 can perform the diagnostic process to diagnose deterioration of the capacitor 28, using the LC series circuit composed of the reactor 22 and the capacitor 28. With this configuration, even when the capacitor 28 deteriorates earlier than expected, such as when the environmental temperature experienced by the capacitor 28 is different from the assumed temperature range, the control unit 50 can diagnose deterioration of the capacitor 28, based on the actual state of the capacitor 28. When the capacitor 28 is diagnosed to be deteriorated, appropriate measures, such as replacement of the capacitor 28, can be taken. In this manner, in the power conversion system 10, the capacitor 28 can maintain the function of reducing ripple current.

While some specific examples have been described in detail, these examples are merely illustrative, and not intended to limit the claims. The technologies stated in the claims include those obtained by modifying or changing the above-illustrated specific examples in various ways. The technical elements described in the specification or drawings exhibit technical usefulness alone or in combination.

What is claimed is:

1. A power conversion system that performs power conversion between a power supply and a load, the power conversion system comprising:
  a DC-DC converter that includes
    a pair of input ends connected to the power supply,
    a pair of output ends connected to the load,
    a reactor having a first reactor end connected to a first input end of the pair of input ends,
    a diode having an anode connected to a second reactor end of the reactor, and a cathode connected to a first output end of the pair of output ends, and a switch having a first switch end connected to the second reactor end, and a second switch end connected to a second input end of the pair of input ends and to a second output end of the pair of output ends;

a capacitor connected between the pair of output ends;

a current sensor configured to measure current values of a current flowing through the reactor; and a control unit configured to control operation of the switch, wherein the control unit is configured to perform a diagnostic process to diagnose deterioration of the capacitor, the diagnostic process including repeatedly turning on and off the switch to add a first alternating-current component that fluctuates at a predetermined frequency to a voltage applied from the power supply to a series circuit, the series circuit being constituted by the reactor and the capacitor, acquiring the current values measured by the current sensor while repeatedly turning on and off the switch, determining a second alternating-current component of the measured current values, calculating a phase difference between the first alternating-current component and the second alternating-current component, or a gain of the second alternating-current component relative to the first alternating-current component, and determining whether the phase difference is greater than a first upper limit value, or the gain is greater than a second upper limit value, wherein the control unit determines that the capacitor is deteriorated in a case where the phase difference is greater than the first upper limit value, or the gain is greater than the second upper limit value.

2. The power conversion system according to claim 1, further comprising a pair of relays provided between the pair of output ends and the load, wherein the control unit is further configured to turn off the pair of relays before executing the diagnostic process.

3. The power conversion system according to claim 1, wherein the diagnostic process further includes notifying a user of the power conversion system that the capacitor is deteriorated in response to a determination by the control unit that the capacitor is deteriorated.

4. The power conversion system according to claim 1, wherein the power supply comprises a fuel cell.

5. The power conversion system according to claim 1, wherein the power conversion system is configured to be installed on a vehicle.

6. The power conversion system according to claim 1, wherein a resonance frequency of the series circuit changes in accordance with a reactance of the reactor and a capacitance of the capacitor, and the phase difference and the gain change in accordance with the resonance frequency of the series circuit.

7. The power conversion system according to claim 1, wherein the current sensor is provided in the series circuit and is connected between the diode and the capacitor.

* * * * *